United States Patent

Krambeck et al.

[15] 3,654,531

[45] Apr. 4, 1972

[54] ELECTRONIC SWITCH UTILIZING A SEMICONDUCTOR WITH DEEP IMPURITY LEVELS

[72] Inventors: Robert H. Krambeck, North Plainfield; Peter T. Panousis, New Providence; Robert J. Strain, Plainfield, all of N.J.

[73] Assignee: Bell Telephone Laboratories Incorporated, Murray Hill, Berkeley Heights, N.J.

[22] Filed: Oct. 24, 1969

[21] Appl. No.: 869,180

[52] U.S. Cl. ....................................317/235 P, 317/234 V

[51] Int. Cl. ....................................................H01l 11/00

[58] Field of Search .......................................317/235, 234

[56] References Cited

UNITED STATES PATENTS

| | | | |
|---|---|---|---|
| 3,271,591 | 9/1966 | Ovshinsky | 307/88.5 |
| 3,448,350 | 6/1969 | Yamishita et al. | 317/234 |
| 3,436,613 | 4/1969 | Gerhard et al. | 317/234 |

*Primary Examiner*—John W. Huckert
*Assistant Examiner*—E. Wojciechowicz
*Attorney*—R. J. Guenther and Arthur J. Torsiglieri

[57] ABSTRACT

An electronic two-terminal switch is furnished by a metal-semiconductor-metal (MSM) layered structure, in which both of the metal layers form ohmic contacts with the semiconductor. The semiconductor is a single crystal, advantageously of silicon, characterized by a concentration of shallow impurity levels (typically donors) which is less than the concentration of deep impurity levels ("traps"). A three-terminal switch can be made therefrom in a planar semiconductor structure, by further providing the structure with a control electrode which is located between the ohmic contacts and which is insulated from the semiconductor.

6 Claims, 3 Drawing Figures

INVENTORS R. H. KRAMBECK
P. T. PANOUSIS
R. J. STRAIN
BY
ATTORNEY

ELECTRONIC SWITCH UTILIZING A SEMICONDUCTOR WITH DEEP IMPURITY LEVELS

FIELD OF THE INVENTION

This invention relates to the field of semiconductor devices, in particular to semiconductor devices characterized by a negative resistance useful for switching elements.

BACKGROUND OF THE INVENTION

In electronic communications systems, it is desirable to have an electronic switching element which has no moving parts thereof and which is simple to fabricate.

It is known in the prior art how to make electronic switching elements using semiconductor devices exhibiting the phenomenon of negative incremental resistance. Typically, the operation of these semiconductor devices depends upon the phenomenon of electrical charge carrier injection into the semiconductor. Until now, moreover, it has been believed by skilled workers that the electrical charge carrier emission vs. capture probability of "traps" in semiconductors was independent of electric field strength. By "traps" is meant impurity levels lying deep within the forbidden energy band gap in semiconductors. These deep lying levels function as charge carrier recombination (capture) centers in the semiconductor.

None of the switching elements in the prior art, however, has been designed to take advantage of our discovery that the emission vs. capture probability of charge carriers by traps in a semiconductor is indeed dependent upon the electric field in the semiconductor. This discovery enables the use of relatively simple semiconductor structures as switching elements, as compared with those in the prior art.

SUMMARY OF THE INVENTION

According to the invention, a semiconductor switching element is made of a preferably monocrystalline semiconductor body having a "uniform" concentration of traps therein. The concentration of traps typically is about an order of magnitude greater than the net "uniform" concentration of majority carriers. Preferably, the majority carriers are electrons in the conduction band of the semiconductor which have been excited thereto from shallow donor levels in the forbidden energy band gap. A pair of ohmic electrodes are attached to this semiconductor body, thereby forming a bistable electrical switching element which is controlled by voltages applied across the electrodes.

In general, the ratio of the "uniform" concentration of traps to the "uniform" net concentration of shallow impurities (donors) advantageously is in the range of between about 1.5 and 15.A ratio below this range results in such a low concentration of traps that the majority carriers (electrons) tend to swamp the traps, so that little, if any, switching is to be expected. On the other hand, a ratio above this range tends to increase both the "turn-on" voltage and the "off" current, so that the switching element tends to be unduly lossy.

In a particular embodiment of the invention, a monocrystalline silicon N-type semiconductor body, having a uniform net significant donor concentration of approximately $5 \times 10^{15}$ per cm$^3$, is diffused with gold atoms to produce a "uniform" concentration of traps of approximately $3 \times 10^{16}$ per cm$^3$. By "uniform" is meant that the concentration is constant throughout the semiconductor body to within a factor of no greater than about two. With these concentrations of donors and traps, the resistivity of the silicon body is of the order of $10^5$ ohm-cm. A pair of aluminum metal ohmic contacts, typically evaporated onto the semiconductor body by known methods, form ohmic connections to the semiconductor at the interfaces of each of these contacts and the semiconductor. Advantageously, the metal contacts are not alloyed with the semiconductor. Thus, these contacts are noninjecting, i.e., the densities of electrical carriers in the semiconductor are not increased by the process of injection from the metal contacts. In another aspect, noninjecting ohmic contacts are characterized by no significant energy band-bending at or near their interfaces with the semiconductor. These ohmic contacts together with the semiconductor body form the switching element of the invention. The metal contacts are electrically connected to the source of electricity to be controlled by the switching element, thereby completing the circuit.

A three-terminal switching element, with electrical isolation between control and controlled circuits, can also be realized in accordance with another specific embodiment of the invention. The (two-terminal) switching element just described is advantageously arranged with both aluminum metal contacts disposed on a single major surface of the semiconductor body. Between these contacts, an insulator layer such as silicon dioxide is deposited on this major surface. Finally, on top of the insulator layer, a metal electrode is deposited which does not make contact with the previously deposited aluminum contacts. Thus, the metal electrode on the insulator layer is insulated from both the semiconductor and the pair of metal contacts. One of the aluminum metal contacts serves as common terminal for the control and the controlled circuits; whereas the other aluminum metal contact serves as the other terminal for the controlled circuit. Moreover, the metal electrode on the insulator layer serves as the other terminal for the control circuit.

This invention, together with its features, advantages, and objects may be better understood from a reading of the following detailed description in conjunction with the diagram in which.

Figure 1:
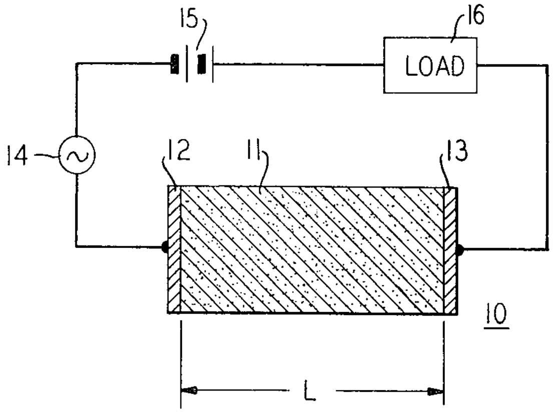
FIG. 1 is a circuit diagram including a two-terminal switching element (not to scale for the sake of clarity) in accordance with a specific embodiment of this invention.

FIG. 1 shows a circuit diagram, including a two-terminal semiconductor switching element 10 in accordance with one embodiment of the invention. The element 10 includes a monocrystalline silicon semiconductor body 11, with a pair of aluminum metal contacts 12 and 13 serving both as ohmic connections to the silicon body 11 and as terminals for connection thereto of an external circuit. The cross section area of the silicon body typically is $10^{-3}$ cm$^2$. The length L of the semiconductor 11 between the contacts 12 and 13 is about 50 microns, which is a factor of two smaller than the length of the semiconductive body in the more common injection semiconductor elements. The silicon body 11 is preferably N-type conductivity semiconductor, containing a net significant shallow impurity level concentration of $5 \times 10^{15}$ donor atoms per cm$^3$. Typically, the donor atoms are either phosphorous, arsenic, or antimony. In addition, the silicon body 11 also contains a uniform concentration of deep impurity levels ("traps"), equal to approximately $3 \times 10^{16}$ traps per cm$^3$; by reason of uniform doping the body with trapping centers, advantageously gold atoms. Typically, in order to ensure uniformity of the trap concentration, the gold is diffused into the silicon body 11 at a temperature of 1,100° C. from 16 to 40 hours; then the body 11 is cooled to room temperature in a relatively short time (of the order of 3 seconds).

The contacts 12 and 13 are connected electrically to the control switching signal source 14. In response to the control signals from the source 14, the semiconductor 11 in the switching element 10 can be switched between a relatively low ("OFF") to a high ("ON") current state. Thereby, the source 14 provides electrical switching control over the current in the load 16 driven by the battery 15.

In order to help understand the properties and operation of the semiconductor switching element 10, curves 21 and 22 show the relationship of current I to voltage V in this element 10. Curve 21 represents the "OFF" state thereof, i.e., the state of higher resistance to the passage of electric current I through the element 10. Curve 22, on the other hand, represents the "ON" state, to which the element 10 can be switched by a sufficient applied voltage V. The exact point at which the element 10 switches from the "OFF" to the "ON" state is a function of the frequency as well as magnitude of the applied voltage. The reason for this functional dependence on frequency is that the element 10 can be switched "ON" by a given (and sufficient) applied voltage V only after a time delay; and this time delay depends upon the magnitude of V. Typically, this time delay is in the range of about 1 to 100 microseconds at room temperature, and decreases with decreasing length L of the semiconductor 11. Thus, the switching time can be controlled by the selection of L. For fixed L, on the other hand, a larger applied voltage V produces a shorter delay time. This dependence on V can be explained on the basis of the sensitivity to V of the emission vs. capture probability of the trap levels in the semiconductor 11.

It should be mentioned that the switching is also light sensitive, in that the switching time delay is also dependent upon the amount of light incident upon the element 10. For reproducibility of switching, therefore, the element 10 is typically kept in the dark during operation in the circuit.

Figure 2:
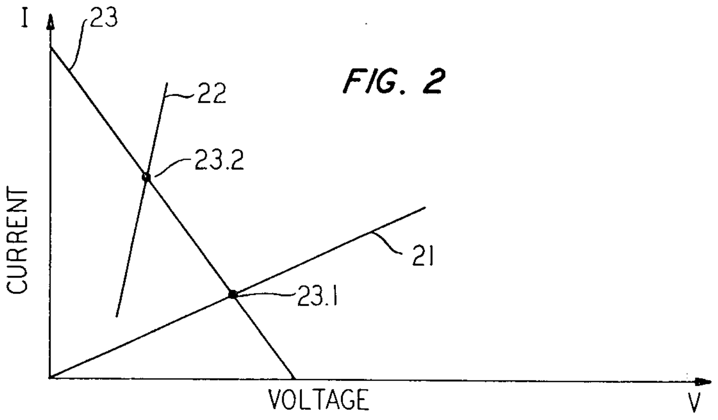
FIG. 2 is an I–V plot (not to scale) of the electrical characteristics of the switching element shown in FIG. 1.

Curve 23 in FIG. 2 represents a load line corresponding to a fixed ohmic resistor as the load 16 in the circuit illustrated in FIG. 1. As should be obvious to the skilled worker, this load line 23 intersects the "ON" and "OFF" curves 22 and 21, respectively, in two points 23.1 and 23.2, which are stable operating points. The signal source 14 can switch the state of the element 10 from the operating point 23.1 ("OFF") to 23.2 ("ON"), or the reverse, by reason of the electric field produced by this signal from the source 14 in the semiconductor 11. By reason of the fact that an increasing control voltage from the source 14 will increase the charge carrier emission probability from the trap levels relative to the capture probability of these levels in the semiconductor 11, and since the emission of one type of carrier (electrons in the case of gold doped silicon) is enhanced more than that of the other type (holes), there is a voltage at which the traps emit so many charge carriers that a regenerative feedback occurs between the emission rates and the electric field. This feedback causes a runaway of space charge, as a result of which tunneling and/or avalanche breakdown occur in the vicinity of the negative biased contact 12. It is this type of runaway of space charge which is believed responsible for producing the "ON" state of the semiconductor 11 in the switching element 10. Moreover, a decreasing control voltage from the source 14 will decrease the charge carrier emission rate while increasing the capture rate; thereby quenching the "ON" state, and switching the semiconductor 11 to the "OFF" state.

The ratio of the current I in the "ON" state of the element 10 to the current I in the "OFF" state ("ON-OFF ratio") of the element 10 described above has been measured to be of the order of ten. The voltage from the source 14 at which the element 10 switches from "OFF" to "ON" is typically about 150 volts; while the voltage at which the element 10 switches from "ON" to "OFF" is about 60 volts.

Figure 3:
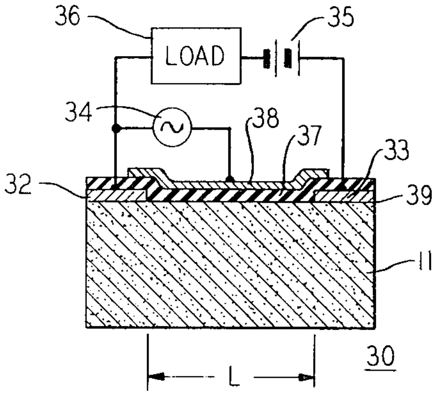
FIG. 3 is a circuit diagram containing a three-terminal switching element (not to scale) in accordance with another specific embodiment of this invention.

In the circuit shown in FIG. 1, some of the signal current from the signal source 14 leaks into the load 16, so that this load is not isolated from the signal source. However, this interaction is not always an undesired effect, or is at least a tolerable disadvantage. In case it is desired to have better isolation between the load and switching signal source, then a three-terminal element is illustrated in the circuit shown in FIG. 3. Here, the switching element 30 is similar to the element 10 described above; except that the element 30 is now provided with the noninjecting aluminum contacts 32 and 33 on portions of a single major surface 39 of the semiconductor 11. The distance L between the contacts 32 and 33 is the same as the length L of the element 10, as previously described. Moreover, the rest of the surface 39 of the semiconductor 11 is covered by a layer of insulator 37, typically silicon dioxide having a thickness of 5,000 A. The metal electrode 38 is deposited on the insulator 37, typically by means of a standard vapor deposition technique. The metal used for this electrode 38 is typically nickel or silver, but any good conductor which is readily deposited on the insulator 37 can be used for the metal in this electrode 38. The same reference numeral has been used to denote the semiconductor 11 in the devices 10 and 30 in FIGS. 1 and 3 respectively, in order to emphasize the fact that the semiconductor material itself has the same structure in both these devices 10 and 30.

The noninjecting ohmic contact 34 serves as a common terminal for the control circuit containing the switching signal source 34 and for the controlled circuit containing the load 36 driven by the battery 35. The electric field produced in the semiconductor 11, in the region beneath the electrode 37 between the contacts 32 and 33, can influence the emission vs. capture probability of the traps in the semiconductor. Depending upon the initial state of the semiconductor 11, this electric field can thus turn "ON" or turn "OFF" space charge runaway in the semiconductor 11 while current is flowing therein between these contacts 32 and 33. Moreover, due to the insulator 37, effective isolation is achieved between the switching signal source 34 and the load 36. Otherwise, operation of the switching element 30 is similar to that of the element 10 described above.

Although this invention has been described in detail in terms of gold impurity traps in N-type silicon semiconductor with aluminum contacts, it should be obvious that other trap impurities in silicon or other semiconductors (N- or P-type) used in conjunction with any contacts which are noninjecting (ohmic) with respect to the semiconductor. Moreover, loads other than ohmic resistors may be used for utilization of the bistable current levels in the switching element.

What is claimed is:

1. An electronic switching circuit which comprises:

a. an electronic switching device whose semiconductive portion consists of a monocrystalline semiconductor body having a uniform concentration of traps and a uniform net concentration of significant shallow impurity levels, the concentration of traps being a factor in the range of about 1.5 and 15 greater than the net concentration of shallow impurity levels;

b. first and second noninjecting ohmic metal contacts in physical contact with the body, said contacts adapted for connection to the circuit; and c. electrical signal voltage means connected to at least one of the metal contacts for producing an electric field in the body between the contacts, the traps being characterized in that an increase in the electric field produces an increase in the emission probability of charge carriers from the traps relative to the capture probability of charge carriers by the traps, the concentration of traps being sufficient such that, in the absence of optical radiation incident on the body, the current flowing through the body between the contacts discontinuously increases when the signal voltage reaches a predetermined value.

2. The switching circuit recited in claim 1 in which the semiconductor body is essentially silicon, the concentration of traps is about $3 \times 10^{16}$ per $cm^3$ and the net concentration of significant shallow impurity levels is about $5 \times 10^{15}$ donors per $cm^3$.

3. The electronic switching circuit recited in claim 2 in which the traps are essentially gold atoms in the silicon semiconductor body.

4. An electronic switching circuit which comprises:

a. the switching circuit recited in claim 1 in which the first and second ohmic contacts are located on a single major surface of the semiconductor body;

b. an insulator layer on at least a portion of said major surface between the first and second metal contacts;

c. an electrode layer disposed on the insulator layer; and d. conductive means for electrically connecting the signal voltage means to the electrode layer in order to produce the electric field in the body in response to the signal.

5. An electronic switching circuit according to claim 4 in which the semiconductor body is essentially silicon, the concentration of traps is about $3 \times 10^{16}$ per $cm^3$, and the net concentration of significant shallow impurity levels is about $5 \times 10^{15}$ donors per $cm^3$.

6. An electronic switching circuit according to claim 5 in which the traps are essentially deep levels of gold impurity in the silicon semiconductor body.

* * * * *